(12) United States Patent
Rao et al.

(10) Patent No.: US 12,349,274 B2
(45) Date of Patent: Jul. 1, 2025

(54) LOW PROFILE SODIMM (SMALL OUTLINE DUAL INLINE MEMORY MODULE)

(71) Applicant: Intel Corporation, Santa Clara, CA (US)

(72) Inventors: Raghavendra Rao, Bangalore (IN); Ranjul Balakrishnan, Bangalore (IN); Shailendra Singh Chauhan, Bengaluru (IN); Sandesh Krishnamurthy Geejagaaru, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 863 days.

(21) Appl. No.: 17/354,540

(22) Filed: Jun. 22, 2021

(65) Prior Publication Data

US 2021/0321516 A1   Oct. 14, 2021

(51) Int. Cl.
*H05K 1/14* (2006.01)
*H05K 1/11* (2006.01)

(52) U.S. Cl.
CPC ............ *H05K 1/111* (2013.01); *H05K 1/141* (2013.01); *H05K 2201/10159* (2013.01); *H05K 2201/10545* (2013.01)

(58) Field of Classification Search
CPC .............. H05K 1/111; H05K 1/141; H05K 2201/10159; H05K 2201/10545
USPC ..................................... 361/679.32
See application file for complete search history.

(56) References Cited

U.S. PATENT DOCUMENTS

| | | | |
|---|---|---|---|
| 6,241,531 B1 | 6/2001 | Roath et al. | |
| 6,354,844 B1 | 3/2002 | Coico et al. | |
| 2013/0055192 A1 | 2/2013 | Colbert et al. | |
| 2015/0171535 A1 | 6/2015 | Li et al. | |
| 2017/0069369 A1* | 3/2017 | Kim | H01L 25/0657 |
| 2019/0051641 A1* | 2/2019 | Lee | H01L 21/563 |
| 2022/0028848 A1* | 1/2022 | Baek | H01L 23/5383 |
| 2022/0394853 A1* | 12/2022 | Shi | H05K 1/111 |
| 2023/0353151 A1* | 11/2023 | Lee | G06F 30/34 |

FOREIGN PATENT DOCUMENTS

JP        3208606 B2    9/2001

* cited by examiner

*Primary Examiner* — Binh B Tran
(74) *Attorney, Agent, or Firm* — Compass IP Law PC

(57) ABSTRACT

A memory module has pads on the top and bottom surfaces of a module printed circuit board (PCB). The pads match the pin layout of one or more memory devices to be mounted on the memory module. The pads on one surface of the PCB electrically interconnect to the memory device(s), and the pads on the other surface electrically interconnect to pads on a system board, such as a motherboard. With the pad layout on the memory module, the pad layout of the system board can be the same for a memory-down implementation and for a removable memory module. The pad layout provides good signal-to-noise performance and can enable a memory module for low power double data rate (LPDDR) memory, double data rate (DDR) memory, and graphics double data rate (GDDR) memory.

22 Claims, 10 Drawing Sheets

LOW PROFILE SODIMM (SMALL OUTLINE DUAL INLINE MEMORY MODULE)

FIELD

Descriptions are generally related to interconnects, and more particular descriptions are related to SODIMM modules.

BACKGROUND

System memory is typically included in a computer system by a module board (such as a dual inline memory module (DIMM)) that connects to a system board, such as a motherboard. SODIMM (small outline DIMM) boards are traditionally designed for connection by insertion of an edge of the SODIMM board into a connector. The connector traditionally has pins to make electrical connection with corresponding pads on the top and bottom of the SODIMM board. The connector pins are designed to have a similar physical length even though the contacts on the bottom of the board are much closer than the contacts on the top of the board. The length is equalized by introducing bends into the bottom connector pin.

The connector pins are relatively long metallic contacts to connect the SODIMM to the system board, and the memory signals must travel along the entire physical length without impedance control. The connector pins tend to introduce significant crosstalk between signals without good ground (GND) shielding between the pins of the SODIMM connector.

At high frequency signaling, bends in the connector pins introduce significant skew in the propagation time of the signals, with complex impedances that are imbalanced between signals on the front and back of the SODIMM board. There is a length difference between the front and back rows of pins of the conventional SODIMM connector. This creates significant skew in the propagation time of the signals leading to complex layout on the motherboard. Pin skew effects are observed for signaling of 4800 MT/s (mega-transfers per second), and the transfer rates will increase to 5600 MT/s, 6400 MT/s, and beyond.

The edge-based connection limits the height reduction that can be provided in computing systems. The skew and crosstalk introduce increasingly negative effects as the transfer frequencies increase, leading to poorer signaling and increased error rates. Traditional approaches to addressing skew involve the addition of filtering, which requires additional components and increases system cost.

BRIEF DESCRIPTION OF THE DRAWING

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a memory module has pads on the top and bottom surfaces of a module printed circuit board (PCB). The pads match the pin layout of one or more memory devices to be mounted on the memory module. The pads on the top surface of the PCB electrically interconnect to the memory device(s), and the pads on the bottom surface electrically interconnect to pads on a system board, such as a motherboard. With the pad layout on the memory module, the pad layout of the system board can be the same for a memory-down implementation and for a removable memory module.

The memory module can provide an alternative to the traditional SODIMM (small outline dual inline memory module). In place of the traditional "dual inline" design with pads on the top and bottom of the module board that are to make contact with a DIMM connector, the memory module described can mount directly on the system board, or mount to the system board through a connector board. Either configuration provides significantly reduced connector pin length. The fact that the connector pads match the pin layout of the memory allows for significantly reduced interconnection complexity on the system board.

Additionally, memory-down implementations lack upgradability in traditional systems because the memory is directly soldered to the system board. With the same layout for either a memory-down or memory module implementation, the computer system can support upgradability of the memory with a removable module that can alternatively connect where the memory would be soldered down.

The pad layout provides good signal-to-noise performance and can enable a memory module for low power double data rate (LPDDR) memory, which currently only has a memory-down implementation available. The pad layout matching and the short interconnection length do not introduce impedance mismatches and introduce very little impedance at all. Thus, the module can allow signaling at high transfer frequencies with very little skew in the propagation time and very little crosstalk.

The pad layout enables the application of a memory module for LPDDR memory, which has traditionally not had a memory module solution available. The pad layout can also enable memory module solutions for memory that traditionally has had memory module solutions available. In one example, the pad layout enables the application of a memory module for double data rate (DDR) memory. In one example, the pad layout enables the application of a memory module for graphics double data rate (GDDR) memory.

Figure 1:
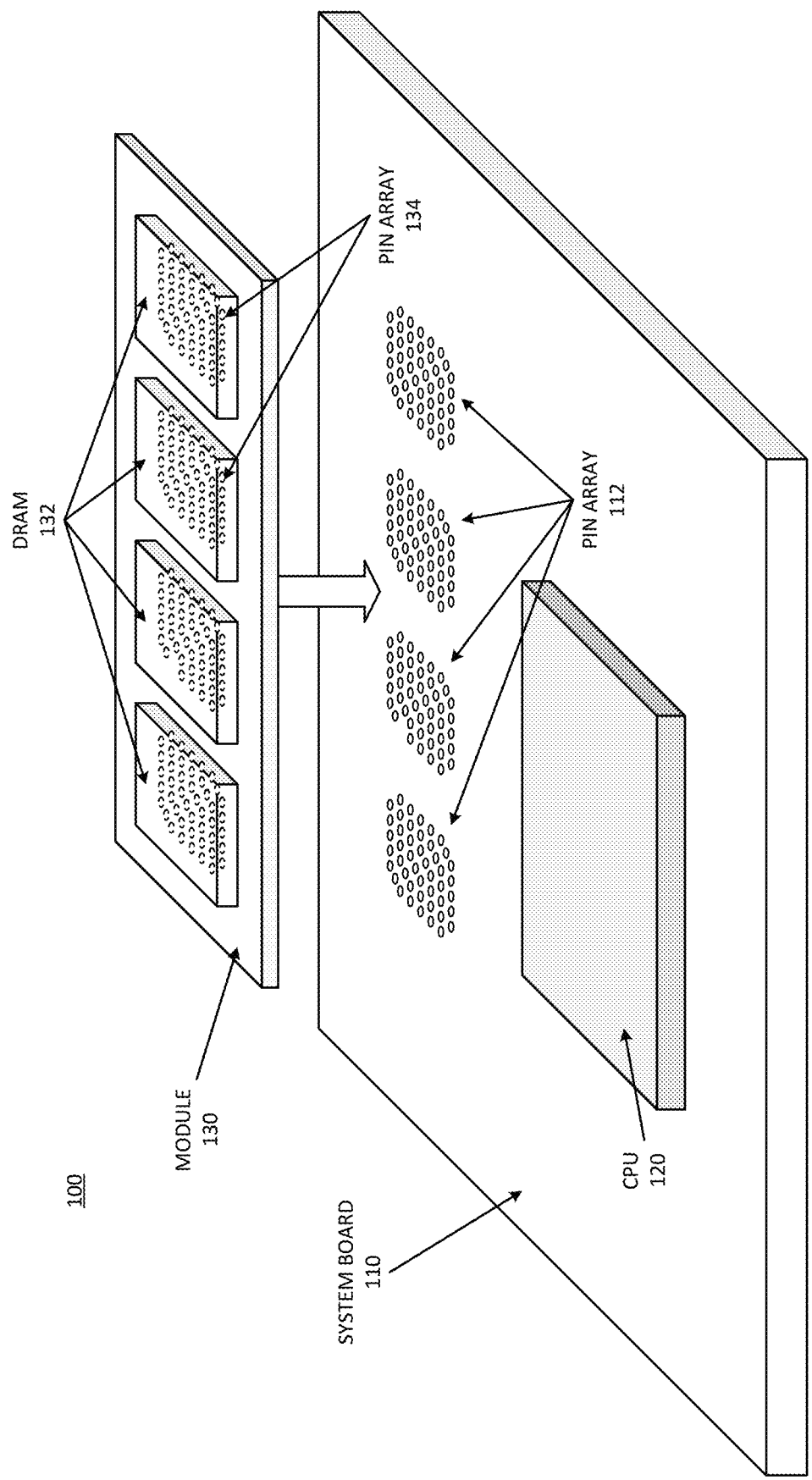
FIG. 1 is a block diagram of an example of a system in which a memory module has a pin array that matches the memory devices on the module.

FIG. 1 is a block diagram of an example of a system in which a memory module has a pin array that matches the memory devices on the module. System 100 includes module 130 to interconnect with system board 110. Module 130 can be an alternative to a SODIMM module. Module 130 provides memory for system board 110.

In one example, system board 110 represents a computer motherboard. System board includes CPU (central processor unit) 120 or other processor to execute system functions in system 100. CPU 120 can execute a host operating system (OS) that controls the operation of system 100.

Module 130 can be considered an alternative to a SODIMM or as a SODIMM replacement. Seeing that module 130 does not have a dual inline configuration, but rather has a connector array on the bottom of the board to match with pin array 112 of system board 110, module 130 would not technically be referred to as a "SODIMM". However, given that module 130 provides the memory in a module board that would traditionally be provided by a SODIMM, module 130 could be referred to as a memory module based on function rather than on technical configuration.

System board 110 includes pin array 112 to provide connection for module 130. Pin array 112 is represented as connection points on system board 110. In one example, pin array 112 includes spring pins soldered to system board 110. In one example, pin array 112 represents an array of contacts or connection points to interface with connectors of a connector board between module 130 and system board 110. In one example, module 130 includes spring pins soldered to the module board to interface with contacts or connection points on system board 110.

The PCB (printed circuit board) of module 130 is a carrier of the memory devices of system 100, represented by DRAM (dynamic random access memory) devices 132. DRAM devices 132 can represent DRAM chips mounted on module 130. System 100 illustrates pin array 134 of DRAM devices 132 to represent the ball out or pin out of DRAM devices 132. Pin array 134 can alternatively be implemented as a pad array. In one example, the board or PCB of module 130 does not have any signal routing.

In one example, the side of the module board 130 on which DRAM device 132 are mounted (which can be referred to as the top side or top surface) will have a connector or contact array to match the pin out or ball out of DRAM devices 132 to enable the DRAM devices to be mounted to module 130. The side of module board 130 that faces system board 110, opposite the side on which DRAM devices 132 are mounted (which can be referred to as a bottom side or bottom surface or system-board facing surface), can also have an array of connectors or contacts that match the pin out or ball out of DRAM devices 132. Thus, module 130 can have a matching pin out to connect to system board 110.

With connector arrays on opposite sides of the board of module 130, DRAM devices 132 can be mounted to module 130, and the top of bottom connector arrays can simply be electrically connected with through-hole vias, through-hole connectors, or other mechanism to provide passthrough routing. Thus, in one example, the board of module 130 has no signal routing, where the board can behave as a carrier for the memory chips. Without any signal routing, the signal would traverse through a connector and interface directly to the pin or ball of DRAM devices 132 to the system-board facing side of module 130.

In one example, pin array 112 provides pins on system board 110 with a 1:1 matching to the pin arrangement of DRAM devices 132 on module 130. In one example, the lack of routing can enable the board of module 130 to be a 2-layer PCB for the memory devices to be mounted. In one example, the PCB of module 130 can include ground (GND) planes in one or more additional board layers to improve EMI (electromagnetic interference) or EMC (electromagnetic coupling) performance of module 130. In one example, such a simple PCB can enable system 100 to have a very thin module PCB (e.g., as low as 0.4 mm) that only needs to maintain structural integrity to interconnect DRAM devices 132.

In one example, there will be no change in design for system board 110 between a memory-down configuration and a memory module configuration. Thus, pin array 112 can match with the pin configuration of DRAM devices 132, allowing devices to be soldered directly to the system board, or to have module 130 mounted on the board. Such an implementation could require additional hardware, such as a connector array mounted on system board 110, but the design of the system board and the routing of the system board could be the same with a non-configurable implementation where memory devices are directly mounted to system board 110, or a configurable design where module 130 can be removably connected to system board 110. Removable connection of module 130 allows upgrading or otherwise changing out the memory in system 100.

In one example, the z-height or system height for the system is much lower than a traditional system design with a SODIMM, potentially 50% reduction or more. The lower height enables thinner and lighter systems without compromising the ability to provide system memory capacity upgrade or serviceability in the field.

Module 130 can be implemented with different types of memory. In one example, DRAM devices 132 represent DRAM devices compatible with a DDR (double data rate). In one example, DRAM devices 132 represent DRAM devices compatible with an LPDDR (low power double data rate) standard. There are no traditional memory module configurations available for LPDDR devices. An implementation of system 100 can provide a memory module configuration that uses LPDDR memory.

The PCB of module 130 can be a board that has a first pad layout on one surface matching the pin layout of DRAM devices 132, to electrically interconnect the board of module 130 to the memory devices. The other surface of the PCB also includes a pad layout matching the pin layout of DRAM devices 132, to electrically interconnect the memory devices to the matching pad layout of pin array 112 on system board 110.

In one example, pin array 134 is electrically interconnected with pin array 112 via a connector array that includes a spring corresponding to each pad of the pad layouts. In one example, the spring connectors are directly mounted to pin array 112, and the pads of module 130 physically contact corresponding springs of the matching pad layout of pin array 112 on the system board. In one example, the spring connectors are directly mounted to module 130, and the pads of pin array 112 physically contact corresponding springs of the matching pad layout of module 130. In one example, the spring connectors are part of a separate board or separate connector (not specifically illustrated in system 100), and spring connectors of the separate connector physically contact corresponding pads of module 130 and corresponding pads of pin array 112.

Figure 2A:
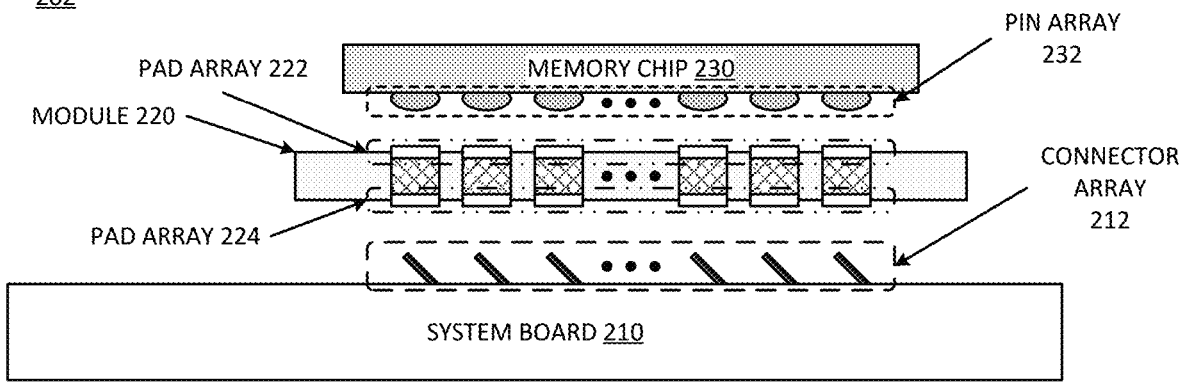
FIGS. 2A-2C are cutaway view diagrams of an example of a memory module to connect to a system board with a connector array on the system board.

FIG. 2A is a cutaway view of an example of a memory module to connect to a system board with a connector array on the system board. System 202 illustrates a system in accordance with an example of system 100. System board 210 represents a system board or a motherboard. In one example, system board 210 includes connector array 212 mounted on the board. Connector array 212 can be referred to as an array of contacts or an array of connector pins. System 202 represents connector array 212 as spring connectors directly mounted (e.g., soldered) to system board 210. In the initial configuration of system 202, connector array 212 has connectors that are extended.

System 202 includes module 220 on which memory chip 230 is mounted. Memory chip 230 includes pin array 232, which has a pin out or pin configuration that is typically defined by specification. Connector array 212 has a connector configuration that matches the configuration of pin array 232. Thus, connector array 212 includes has a connector corresponding to each pin of pin array 232. In one example, connector array 212 is a compression-based connection array. A compression-based connection array can be similar to a compression mechanism of an LGA (land grid array) socket or LGA package.

In one example, module 220 includes pad array 222 on a top surface to interconnect with pin array 232 of memory chip 230. In one example, module 220 includes pad array 224 on a bottom surface to interconnect with connector array 212 of system board 210.

Figure 2B:
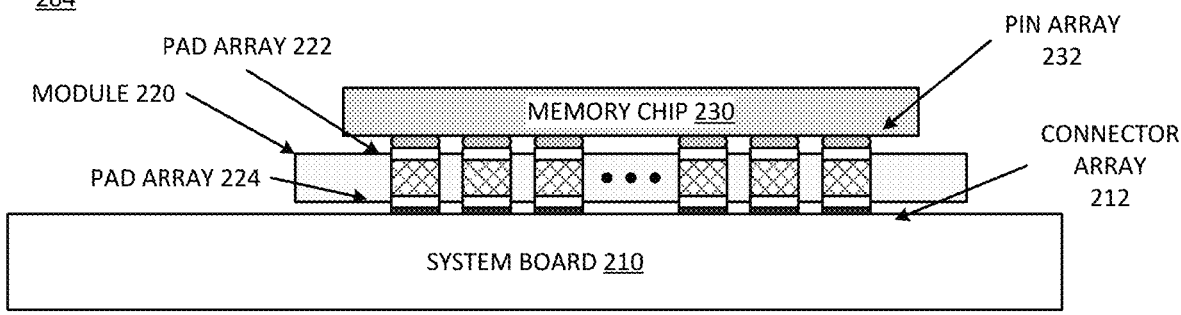

FIG. 2B are cutaway view diagrams of an example of a memory module to connect to a system board with a connector array on the system board. System 204 illustrates an example of system 202. System 202 can be referred to as a pre-assembly and system 204 can be referred to as post-assembly.

In system 204, module 220 includes pad array 222 connected to pin array 232 to secure memory chip 230 to module 220. Module 220 includes pad array 224 electrically connected to pad array 222 through the module board to enable electrical connection of memory chip 230 to connector array 212 of system board 210 through module 220. Connector array 212 is illustrated as being compressed under pad array 224 when module 220 is secured to system board 210.

Figure 2C:
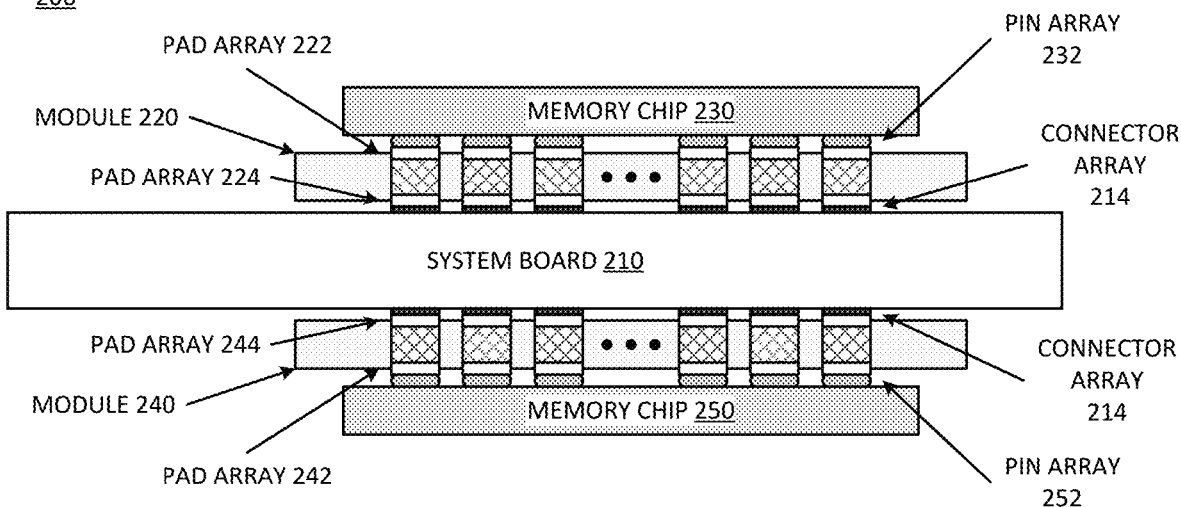

FIG. 2C are cutaway view diagrams of an example of a memory module to connect to a system board with a connector array on the system board. System 206 illustrates an example of system 202 with two memory modules connected to system board 210. System 206 can be referred to as a post-assembly view of system 202. System 206 can represent an example of system 204 with an additional memory module.

In system 206, module 220 includes pad array 222 connected to pin array 232 to secure memory chip 230 to module 220. Module includes pad array 224 electrically connected to pad array 222 to enable electrical connection of memory chip 230 to system board 210 through module 220. Connector array 212 is illustrated as being compressed under pad array 224 when module 220 is secured to system board 210.

System 206 also includes module 240 having pad array 242 connected to pin array 252 to secure memory chip 250 to module 240. Module 240 includes pad array 244 electrically connected to pad array 242 through the module board to enable electrical connection of memory chip 250 to system board 210 through module 240. Connector array 214 is illustrated as being compressed under pad array 244 when module 240 is secured to system board 210. Connector array 214 is only shown as compressed, but it will be understood that connector array 214 can be the same as connector array 212, matching with pad array 244, which in turn matches pin array 252.

In traditional systems that utilize two different SODIMMs on a channel, the margin timing degradation is worse, which reduces signal quality of communication with the memory. Ensuring that there is symmetry when using two SODIMMs can reduce the degradation, but still experiences limitations in the frequency of operation. System 206 has improved signal quality with the use of module 220 and module 240, which enables the use of two modules per channel. The use of two memory modules per channel is traditionally referred to as a 2DPC (two DIMMs per channel) configuration. While module 220 and module 240 are not technically DIMMs, the configuration of system 206 can effectively be referred to as a 2DPC implementation that has minimal signal degradation.

In one example, a 1DPC (one DIMM per channel) implementation in accordance with system 204 can have a z-height of approximately 1.5 mm (millimeters) minimum and upward in height. A 2DPC implementation in accordance with system 206 can have a z-height in the range of approximately 1.5-3.5 mm and upward in height. The exact z-height will depend on the PCB thickness of the memory modules and package height of the memory chips.

Figure 3A:
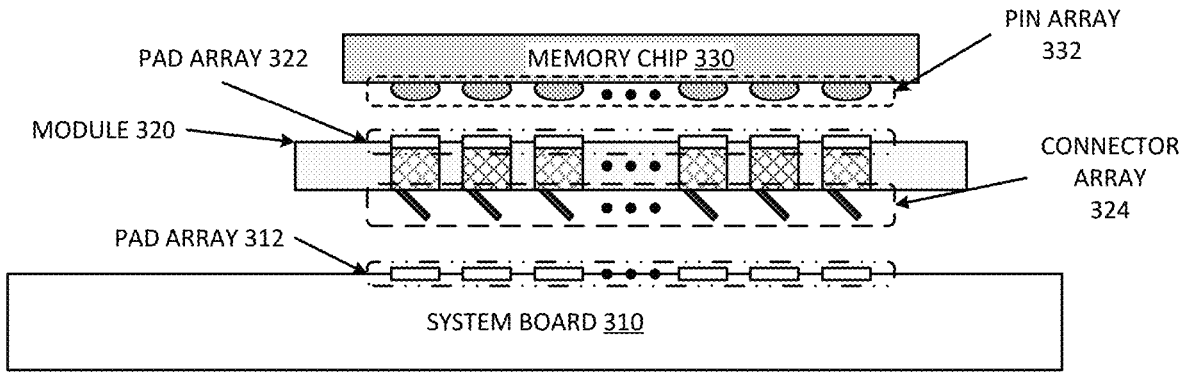
FIGS. 3A-3C are cutaway view diagrams of an example of a memory module to connect to a system board with a connector array on the module board.

FIG. 3A is a cutaway view of an example of a memory module to connect to a system board with a connector array on the memory module board. System 302 illustrates a system in accordance with an example of system 100. System board 310 represents a system board or a motherboard. In one example, system board 310 includes pad array 312 on the surface of the board. Pad array 312 represents pads or connection points on system board 310.

System 302 includes module 320 on which memory chip 330 is mounted. Memory chip 330 includes pin array 332, which has a pin out or pin configuration that is typically defined by specification. Pad array 312 has a connector configuration that matches the configuration of pin array 332. Thus, pad array 312 includes a pad corresponding to each pin of pin array 332.

In one example, module 320 includes connector array 324 on the surface that faces system board 310. In one example, connector array 324 is soldered directly onto module 320. Connector array 324 can be referred to as an array of contacts or an array of connector pins. System 302 represents connector array 324 as spring connectors directly mounted (e.g., soldered) to module 320. In the initial configuration of system 302, connector array 324 has connectors that are extended. In one example, connector array 324 is a compression-based connection array. A compression-based connection array can be similar to a compression mechanism of an LGA (land grid array) socket or LGA package.

In one example, module 320 includes pad array 322 on a top surface to interconnect with pin array 332 of memory chip 330. In one example, module 320 includes connector array 324 on a bottom surface to interconnect with pad array 312 of system board 310.

Figure 3B:
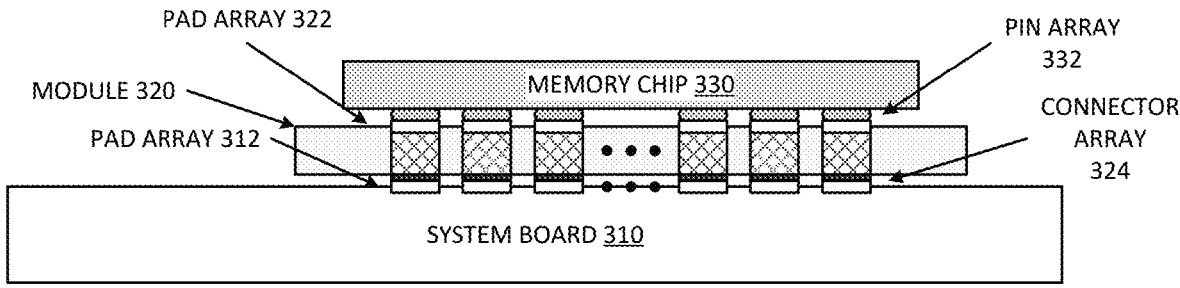

FIG. 3B is a cutaway view of an example of a memory module to connect to a system board with a connector array on the memory module. System 304 illustrates an example of system 302. System 302 can be referred to as a pre-assembly and system 304 can be referred to as post-assembly.

In system 304, module 320 includes pad array 322 connected to pin array 332 to secure memory chip 330 to module 320. Module 320 includes connector array 324 electrically connected to pad array 322 through the module board to enable electrical connection of memory chip 330 to pad array 312 of system board 310 through module 320. Connector array 324 is illustrated as being compressed under over pad array 312 when module 320 is secured to system board 310.

Figure 3C:
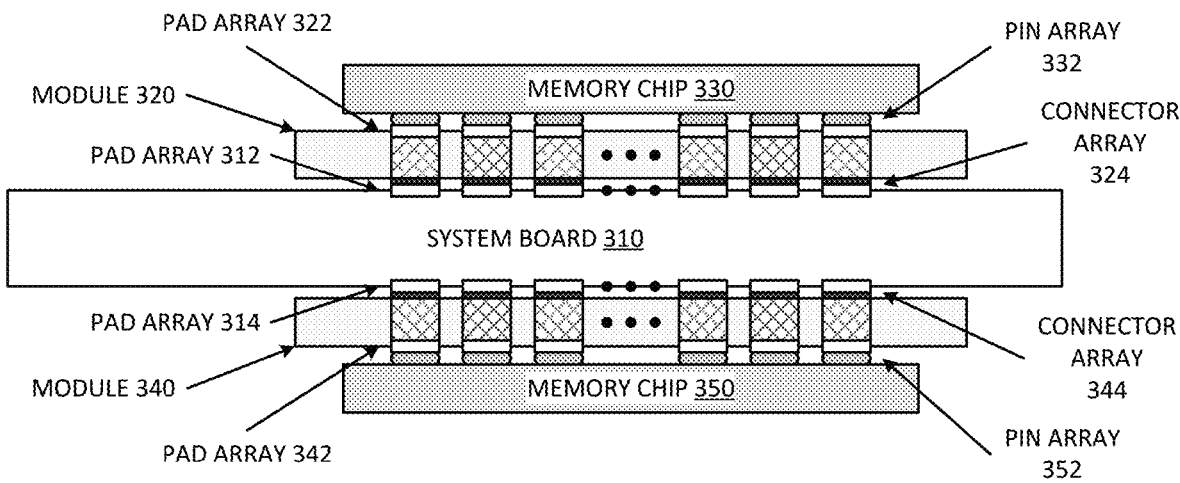

FIG. 3C is a cutaway view of an example of a memory module to connect to a system board with a connector array on the memory module. System 306 illustrates an example of system 302 with two memory modules connected to system board 310. System 306 can be referred to as a post-assembly view of system 302. System 306 can represent an example of system 304 with an additional memory module.

In system 306, module 320 includes pad array 322 connected to pin array 332 to secure memory chip 330 to module 320. Module 320 includes connector array 324 electrically connected to pad array 322 through the module board to enable electrical connection of memory chip 330 to pad array 312 of system board 310 through module 320. In one example, connector array 324 is soldered directly onto module 320. Connector array 324 is illustrated as being compressed over pad array 312 when module 320 is secured to system board 310.

System 306 also includes module 340 includes pad array 342 connected to pin array 352 to secure memory chip 350 to module 340. Module 340 includes connector array 344 electrically connected to pad array 342 through the module board to enable electrical connection of memory chip 350 to pad array 314 of system board 310 through module 340. Connector array 344 is illustrated as being compressed over pad array 314 when module 340 is secured to system board 310. Connector array 314 is only shown as compressed, but it will be understood that connector array 314 can be the same as connector array 312, matching with pad array 344, which in turn matches pin array 352.

In traditional systems that utilize two different SODIMMs on a channel, the margin timing degradation is worse, which reduces signal quality of communication with the memory. Ensuring that there is symmetry when using two SODIMMs can reduce the degradation, but still experiences limitations in the frequency of operation. System 306 has improved signal quality with the use of module 320 and module 340, which enables the use of two modules per channel. The use of two memory modules per channel is traditionally referred to as a 2DPC (two DIMMs per channel) configuration. While module 320 and module 340 are not technically DIMMs, the configuration of system 306 can effectively be referred to as a 2DPC implementation that has minimal signal degradation.

In one example, a 1DPC (one DIMM per channel) implementation in accordance with system 304 can have a z-height of approximately 1.5 mm (millimeters) minimum and upward in height. A 2DPC implementation in accordance with system 306 can have a z-height in the range of approximately 1.5-4.0 mm and upward in height. The exact z-height will depend on the PCB thickness of the memory modules and package height of the memory chips.

Figure 4A:
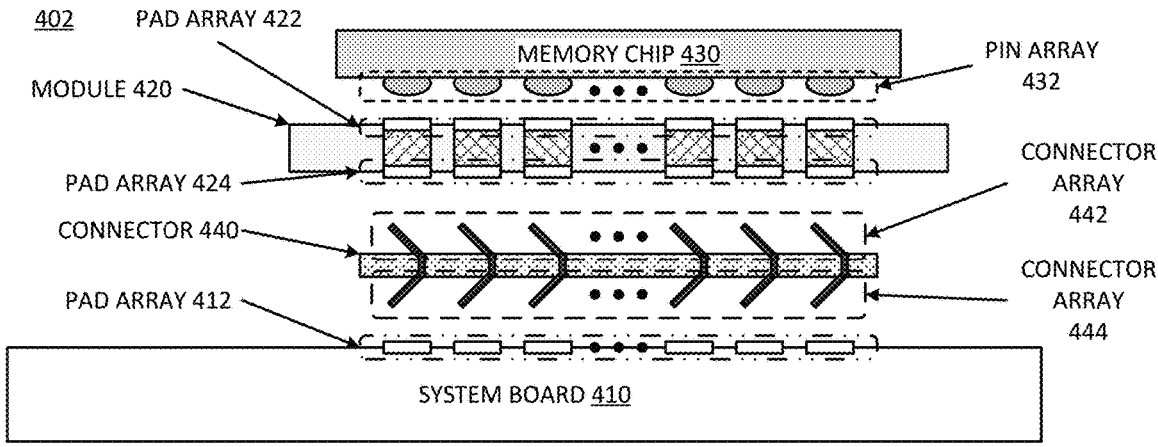
FIGS. 4A-4C are cutaway view diagrams of an example of a memory module to connect to a system board via an interposer board with a connector array.

FIG. 4A is a cutaway view of an example of a memory module to connect to a system board via a connector board. System 402 illustrates a system in accordance with an example of system 100. System board 410 represents a system board or a motherboard. In one example, system board 410 includes pad array 412 on the surface of the board. Pad array 412 represents pads or connection points on system board 410.

System 402 includes module 420 on which memory chip 430 is mounted. Memory chip 430 includes pin array 432, which has a pin out or pin configuration that is typically defined by specification. Pad array 412 has a connector configuration that matches the configuration of pin array 432. Thus, pad array 412 includes a pad corresponding to each pin of pin array 332.

In one example, module 420 includes pad array 424 on the surface that faces system board 410. System 406 includes connector 440, which represents a connector board or interposer board or connector. Connector 440 represents a separate or standalone connector for system 406. Connector 440 includes connector array 442 to interconnect with pad array 424 of module 420 and connector array 444 to interconnect with pad array 412 of system board 410.

In one example, connector 440 is a PCB with connector array 442 and connector array 444 soldered directly onto the connector board. Connector array 442 and connector array 444 can be referred to as arrays of contacts or arrays of connector pins. System 402 represents connector array 442 and connector array 444 as spring connectors directly mounted (e.g., soldered) to the connector board. In the initial configuration of system 402, connector array 442 and connector array 444 have connectors that are extended. In one example, the connector arrays are compression-based connection arrays. A compression-based connection array can be similar to a compression mechanism of an LGA (land grid array) socket or LGA package.

In one example, module 420 includes pad array 422 on a top surface to interconnect with pin array 432 of memory chip 430. In one example, module 420 includes pad array 424 on a bottom surface to interconnect with connector array 442 of connector 440. In one example, system board 410 includes pad array 412 to interconnect with connector array 444 of connector 440. Connector array 442 and connector array 444 are electrically connected through the connector board.

In one example, connector 440 is a board with spring connectors on both surfaces. In one example, connector 440 represents an open connector with rows or rows and columns of structural elements with connector pins extending from each side of the connector. The structural elements can be, for example, plastic or composite structures having metallic connector pins mounted on the structural elements to have a connector pin corresponding to each pin of pin array 432.

Figure 4B:
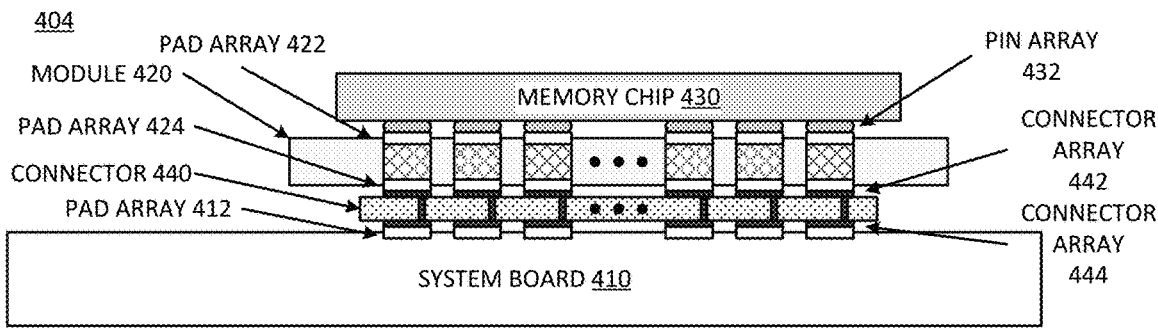

FIG. 4B is a cutaway view of an example of a memory module to connect to a system board via a connector board. System 404 illustrates an example of system 402. System 402 can be referred to as a pre-assembly and system 404 can be referred to as post-assembly.

In system 404, module 420 includes pad array 422 connected to pin array 432 to secure memory chip 430 to module 420. Module 420 includes pad array 422 electrically connected to pad array 424 through the module board to enable electrical connection of memory chip 430 to pad array 412 of system board 410 through connector 440. Connector array 442 of connector 440 is illustrated as being compressed in contact with pad array 424 when module 420 is secured to system board 410. Connector array 444 of connector 440 is illustrated as being compressed in contact with pad array 412 when module 420 is secured to system board 410.

Figure 4C:
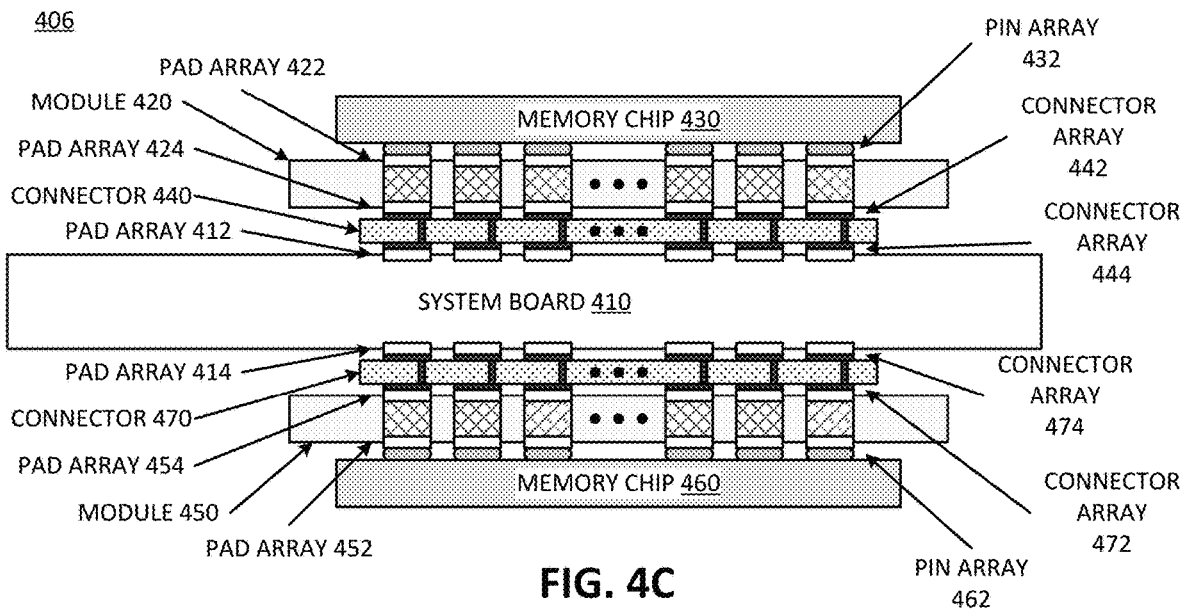

FIG. 4C is a cutaway view of an example of a memory module to connect to a system board via a connector board. System 406 illustrates an example of system 402 with two memory modules connected to system board 410. System 406 can be referred to as a post-assembly view of system 402. System 406 can represent an example of system 404 with an additional memory module.

In system 406, module 420 includes pad array 422 connected to pin array 432 to secure memory chip 430 to module 420. Module 420 includes pad array 422 electrically connected to pad array 424 through the module board to enable electrical connection of memory chip 430 to pad array 412 of system board 410 through connector 440. Connector array 442 is illustrated as being compressed in contact with pad array 424 when module 420 is secured to system board 410. Connector array 444 is illustrated as being compressed in contact with pad array 412 when module 420 is secured to system board 410.

System 406 also includes module 450 includes pad array 452 connected to pin array 462 to secure memory chip 460 to module 450. Module 450 includes pad array 452 electrically connected to pad array 454 through the module board to enable electrical connection of memory chip 460 to pad array 414 of system board 410 through connector 450. Connector array 472 of connector 470 is illustrated as being compressed in contact with pad array 454 when module 450 is secured to system board 410. Connector array 474 of connector 470 is illustrated as being compressed in contact with pad array 414 when module 450 is secured to system board 410.

In traditional systems that utilize two different SODIMMs on a channel, the margin timing degradation is worse, which reduces signal quality of communication with the memory. Ensuring that there is symmetry when using two SODIMMs can reduce the degradation, but still experiences limitations in the frequency of operation. System 406 has improved signal quality with the use of module 420 and connector 440 and module 450 and connector 470, which enables the use of two modules per channel. The use of two memory modules per channel is traditionally referred to as a 2DPC (two DIMMs per channel) configuration. While module 420 and module 450 are not technically DIMMs, the configuration of system 406 can effectively be referred to as a 2DPC implementation that has minimal signal degradation.

In one example, a 1DPC (one DIMM per channel) implementation in accordance with system 304 can have a z-height of approximately 2.0 mm (millimeters) upward in height. A 2DPC implementation in accordance with system 406 can have a z-height in the range of approximately 1.5-4.0 mm and upward in height. The exact z-height will depend on the PCB thickness of the memory modules, the thickness or z-height of connector 440 and connector 470, and the package height of the memory chips.

Figure 5:
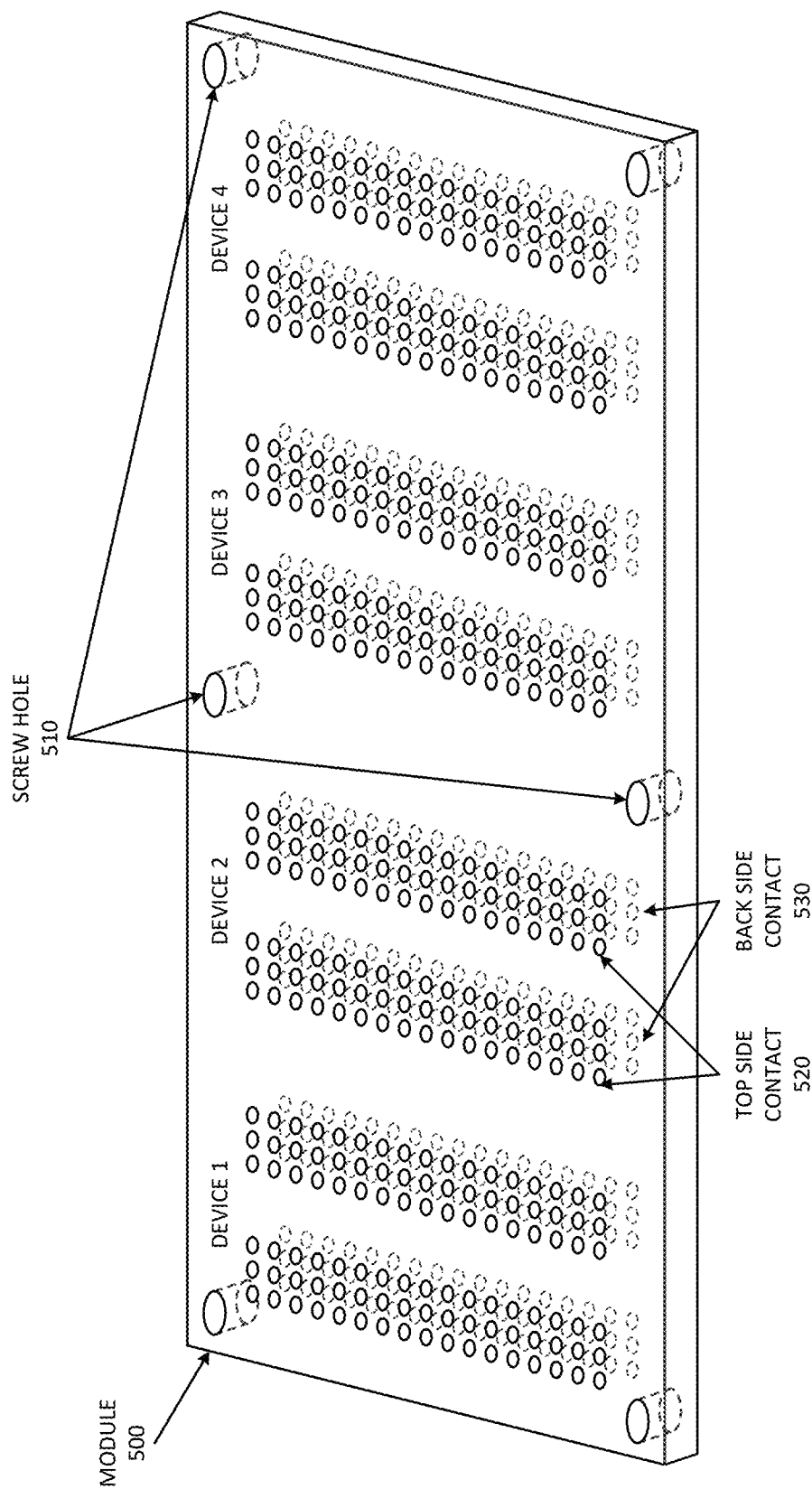
FIG. 5 is an example of a layout of a module board.

FIG. 5 is an example of a layout of a module board. Module 500 illustrates an example of a memory module board in accordance with an example of system 100, system 202, system 302, or system 402.

Module 500 illustrates pad positions for four memory devices, Device[1:4]. The diagram specifically illustrates top side contacts 520 and back side contacts 530. For simplicity, top side contacts 520 and back side contacts 530 are only identified with respect to Device 2. Top side contacts 520 represent pads to interconnect with a memory device. The solid line contacts represent the contacts on the top side of module 500.

Back side contacts 530 are represented with dashed lines. In one example, back side contacts 530 represent pads to interconnect with connector pins of a system board or connector pins of a connector board. In one example, back side contacts 530 represent connector pins to interconnect with pads on the system board. Thus, back side contacts 530 can represent a contact assembly on module 500 to compress to pads on the system board.

In one example, module 500 includes screw holes 510. Screw holes 510 represent holes through the module board to receive screws. When screws are used, the screws would extend into corresponding screw holes of the system board to secure the memory module to the system board. The securing of the module board to the system board with screws can provide the force to hold the connector pins or connector screws in electrical contact with the corresponding pads.

Module 500 includes top side contacts 520 having the same footprint as the ball pattern of the memory devices that will be received. In one example, back side contacts 530 have a mirror-image layout as top side contacts 520, and the identical layout as the memory devices to mount on module 500. It will be understood that different pin layouts of different memory devices can be accommodated by different contact configuration on module 500 corresponding to the memory device to be mounted on it.

Figure 6:
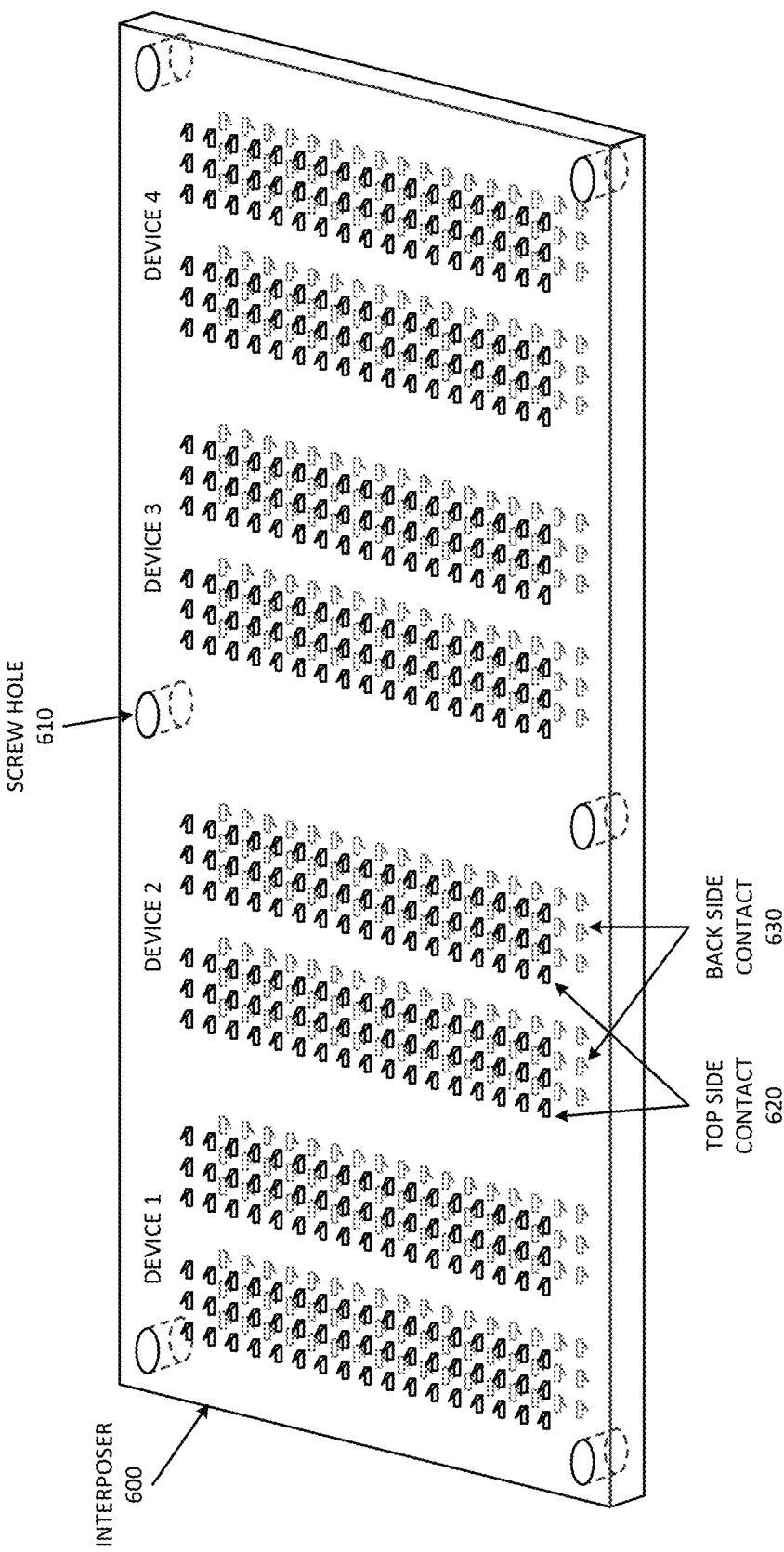
FIG. 6 is an example of a layout of an interposer board.

FIG. 6 is an example of a layout of an interposer board. Interposer 600 illustrates an example of a connector board in accordance with an example of system 100 or system 402.

Interposer 600 illustrates connector pin positions for four memory devices, Device[1:4]. The diagram specifically illustrates the connector pins as compression-based contacts. The compression-based contacts can be or include spring contacts or non-spring contacts. A compression-based contact adjusts shape in response to the application of force, compressing the shape of the contact while making an electrical connection. Top side contacts 620 and back side contacts 630 represent connector mechanisms on the top and bottom sides of the connector board, respectively. For simplicity, top side contacts 620 and back side contacts 630 are only identified with respect to Device 2. Top side contacts 620 represent connectors to interconnect with a memory module board. The dark lines represent the springs on the top side of interposer 600. Back side springs 630 are represented with light gray. In one example, back side contacts 630 represent connectors to interconnect with pads of a system board.

In one example, interposer 600 includes screw holes 610. Screw holes 610 represent holes through the connector board to receive screws. When screws are used, the screws would extend through a memory module, through interposer 600, and into corresponding screw holes of the system board to secure the memory module and connector board to the system board. The securing of the connector board with screws can provide the force to hold the connector pins or connector screws in electrical contact with the corresponding pads of the memory module and system board.

Interposer 600 includes top side contacts 620 having the same layout as the ball pattern of the memory devices of a memory module with which interposer 600 will interconnect. In one example, back side contacts 630 have a mirror-image layout as top side contacts 620, and the identical layout as the memory devices. It will be understood that different pin layouts of different memory devices can be accommodated by different connector configuration on interposer 600 corresponding to the memory device to be connected.

Figure 7:
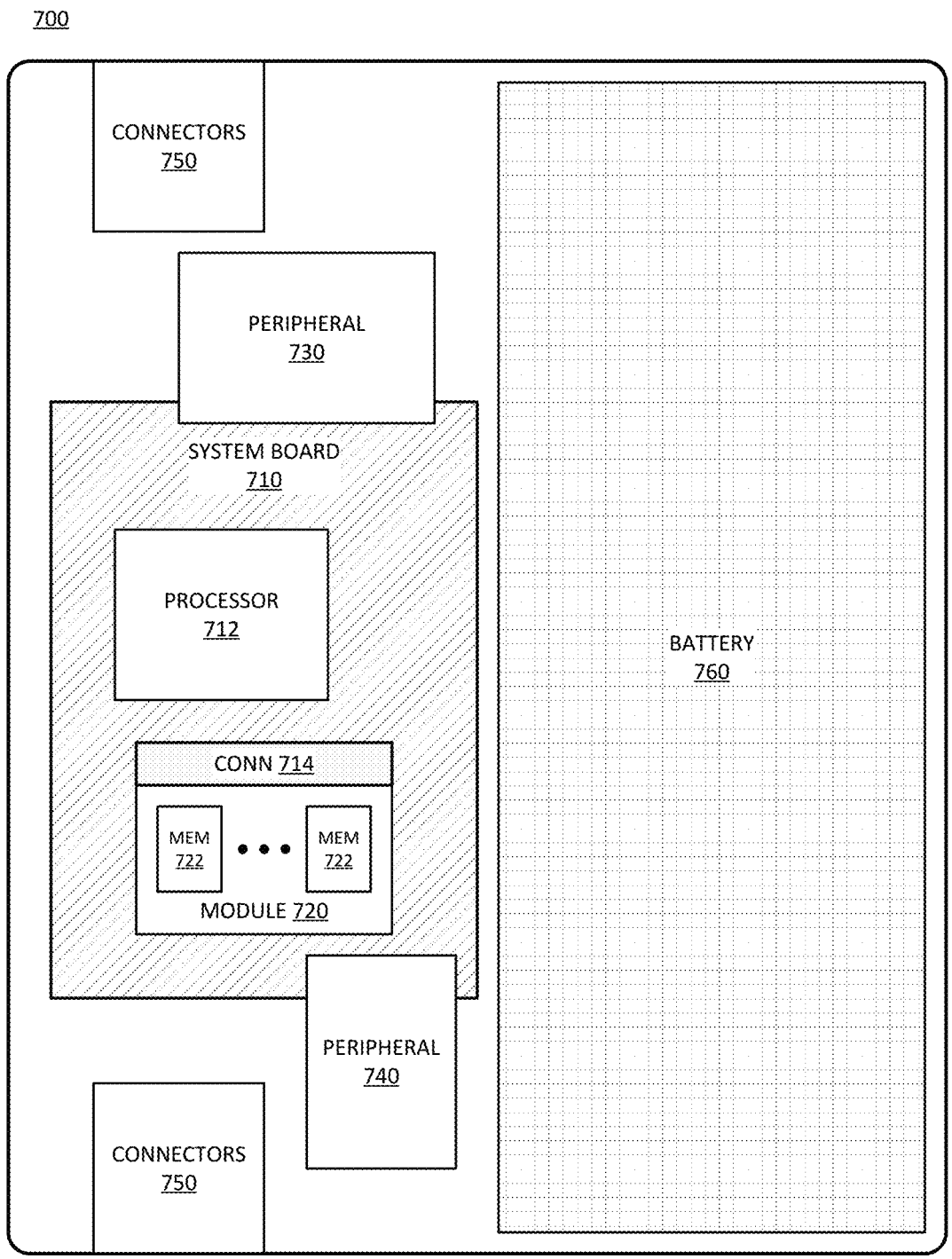
FIG. 7 is a block diagram of an example of a computer system with a memory module connector to mount to a planar system board.

FIG. 7 is a block diagram of an example of a computer system with a memory module connector to mount to a planar system board. System 700 represents a computing system or a computing device. For example, system 700 can be a laptop computer, a tablet computer, a smart phone or other handheld electronic device, or a two-in-one device. The display for the device is not explicitly shown in system 700, but can be a screen that covers device, or can be a display that connects via hinge, built on top of the chassis of system 700, or connect with some other connector (not shown).

In one example, system 700 has a clamshell design, where the processing elements and keyboard are fixed to the display element. In one example, system 700 is a detachable computer, where the processor and display are part of a common unit has a detachable keyboard.

System 700 includes system board 710, which represents a primary PCB to control the operation in system 700. System board 710 can be referred to as a motherboard in certain computer configurations. System board 710 represents a rectangular system board, which is a traditional system board configuration, with a length and a width (x and y axis, not specifically labeled for orientation in system 700).

System board 710 includes processor 712, which represents a host processor or main processing unit for system 700. Processor 712 can be a central processing unit (CPU) or system on a chip (SOC) that includes a CPU or other processor. In one example, processor 712 can include a graphics processing unit (GPU), which can be the same as the primary processor, or separate from the primary processor.

System board 710 includes operational memory or system memory for the computing device. The operational memory generally is, or includes, volatile memory, which has indeterminate state if power is interrupted to the memory. In one example, system 700 includes memory provided by module 720. Module 720 illustrates a module that includes multiple memory devices or memory chips, represented by memory (MEM) 722. Module 720 can be a memory module in accordance with any example herein, such as module 130 of system 100, module 220 of system 202, module 320 of system 302, or module 420 of system 402.

Module 720 interconnects with system board 710 via a connector array that has a connector layout that matches the pin layout of memory 722. Connector (CONN) 714 represents the interconnection between module 720 and system board 710. In one example, connector 714 represents an array of micro-springs on system board 710. In one example, connector 714 represents an array of micro-springs on module 720. In one example, connector 714 represents a standalone connector board or connector component that interfaces between module 720 and system board 710. Processor 712 utilizes memory 722 to control operation of system 700.

System 700 includes one or more peripherals connected to system board 710. Peripheral 730 and peripheral 740 represent different peripherals that could be included in system 700. The size and number of the peripherals can be different in different system configurations. In one example, system 700 includes a solid state drive (SSD) as a peripheral device. In one example, system 700 includes a computation accelerator as a peripheral device. In one example, system 700 includes a wireless communication module or other network interface. A wireless communication module can be or include WiFi, Bluetooth (BT), WWAN (wireless wide area network) such as cellular, or other wireless communication.

System 700 includes connectors 750, which represent I/O (input/output) connectors to devices external to system 700. For example, connectors 750 can be or include USB (universal serial bus) connectors, video connectors such as HDMI (high definition media interface), company-proprietary connectors, or other I/O connectors.

System 700 includes battery 760 to power the system. In one example, system board 710 at least partially overlaps battery 760. It will be understood that the relative size, spacing, and location of components will be different depending on what type of system is implemented for system 700. The size and layout of system 700 is not necessarily intended to be typical or representative of each possible implementation, but illustrates possible components for such an implementation.

Figure 8:
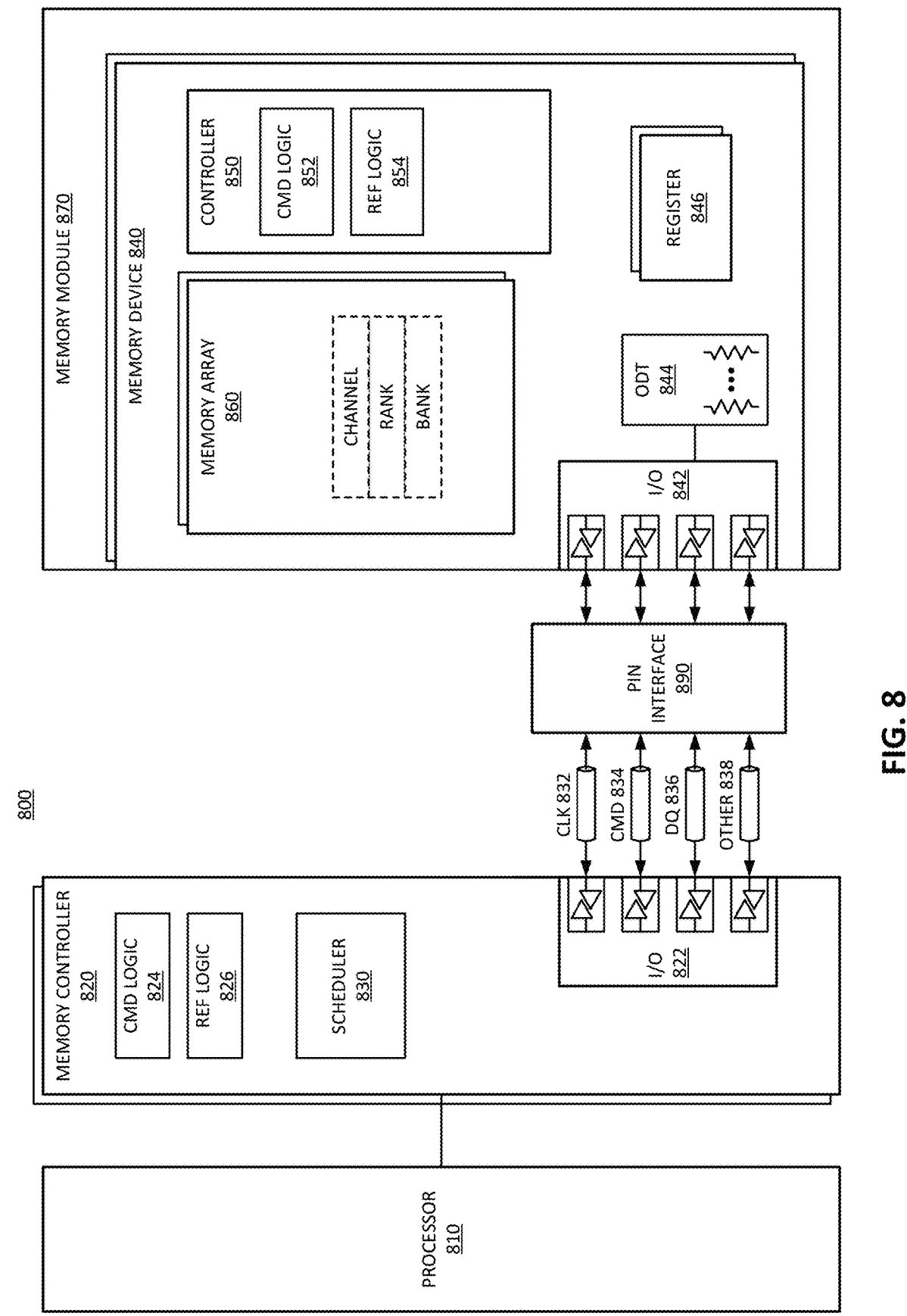
FIG. 8 is a block diagram of an example of a memory subsystem in which a memory module interface can be implemented.

FIG. 8 is a block diagram of an example of a memory subsystem in which a memory module interface can be implemented. System 800 includes a processor and elements of a memory subsystem in a computing device. System 800 is an example of a system in accordance with an example of system 100 or system 700.

In one example, system 800 includes pin interface 890 to interconnect memory module 870 and memory devices 840 of the memory module with memory controller 820. Memory controller 820 is disposed on a system board that includes pins, pads, or connectors to connect with memory device 840. Pin interface 890 represents an interconnection between memory module 870 and a system board in accordance with any example herein. In one example, pin interface 890 represents connectors on the system board to interconnect with pads on memory module 870. In one example, pin interface 890 represents connectors on memory module 870 to interconnect with the system board. In one example, pin interface 890 represents a connector to interconnect with pads on the system board and with pads on memory module 870.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 800 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 8B10B encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a x4 interface, a x8 interface, a x16 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 840 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die. In one example, each memory device 840 can interface with multiple (e.g., 2) channels per device or die. Each memory device 840 includes I/O interface logic 842, which has a bandwidth determined by the implementation of the device (e.g., x16 or x8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. The remaining bits of the word will be provided or received by other memory devices in parallel.

In one example, memory devices 840 are disposed directly on a motherboard or host system platform (e.g., a PCB (printed circuit board) on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include one or more memory arrays 860. Memory array 860 represents addressable memory locations or storage locations for data. Typically, memory array 860 is managed as rows of data, accessed via wordline (rows) and bitline (individual bits within a row) control. Memory array 860 can be organized as separate channels, ranks, and banks of memory. Channels may refer to independent control paths to storage locations within memory devices 840. Ranks may refer to common locations across multiple memory devices (e.g., same row addresses within different devices) in parallel. Banks may refer to sub-arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822 (for example, ODT for DQ lines or ODT for CA lines), and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used for memory resources that are volatile and need to be refreshed to retain a deterministic state. In one example, refresh logic 826 indicates a location for refresh, and a type of refresh to perform. Refresh logic 826 can trigger self-refresh within memory device 840, or execute external refreshes which can be referred to as auto refresh commands) by sending refresh commands, or a combination. In one example, controller 850 within memory device 840 includes refresh logic 854 to apply refresh within memory device 840. In one example, refresh logic 854 generates internal operations to perform refresh in accordance with an external refresh received from memory controller 820. Refresh logic 854 can determine if a refresh is directed to memory device 840, and what memory resources 860 to refresh in response to the command.

Figure 9:
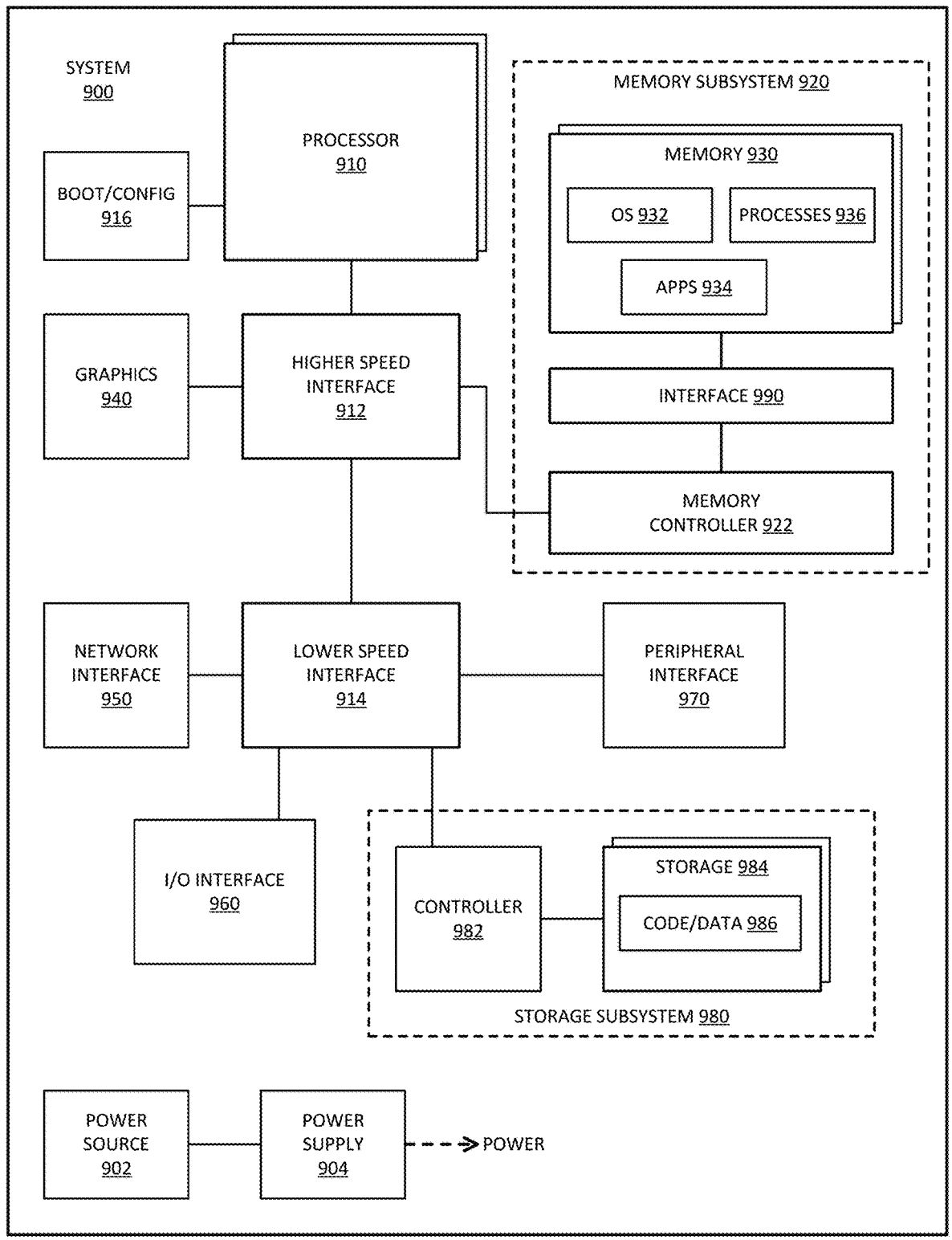
FIG. 9 is a block diagram of an example of a computing system in which a memory module interface can be implemented.

FIG. 9 is a block diagram of an example of a computing system in which a memory module interface can be implemented. System 900 represents a computing device in accordance with any example herein, and can be a laptop computer, a desktop computer, a tablet computer, a server, a gaming or entertainment control system, embedded computing device, or other electronic device. System 900 represents a computer system in accordance with an example of system 100 or system 700.

In one example, system 900 includes interface 990 to interconnect a memory module that holds memory 930 with memory controller 922. Memory controller 922 is disposed on a system board that includes pins, pads, or connectors to connect with memory 930. Interface 990 represents an interconnection between memory 930 and a system board in accordance with any example herein. In one example, interface 990 represents connectors on the system board to interconnect with pads on a memory module of memory 930. In one example, interface 990 represents connectors on a memory module of memory 930 to interconnect with the system board. In one example, interface 990 represents a connector to interconnect with pads on the system board and with pads on a memory module of memory 930.

System 900 includes processor 910 can include any type of microprocessor, central processing unit (CPU), graphics processing unit (GPU), processing core, or other processing hardware, or a combination, to provide processing or execution of instructions for system 900. Processor 910 can be a host processor device. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

System 900 includes boot/config 916, which represents storage to store boot code (e.g., basic input/output system (BIOS)), configuration settings, security hardware (e.g., trusted platform module (TPM)), or other system level hardware that operates outside of a host OS. Boot/config 916 can include a nonvolatile storage device, such as read-only memory (ROM), flash memory, or other memory devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more varieties of random-access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, NAND, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
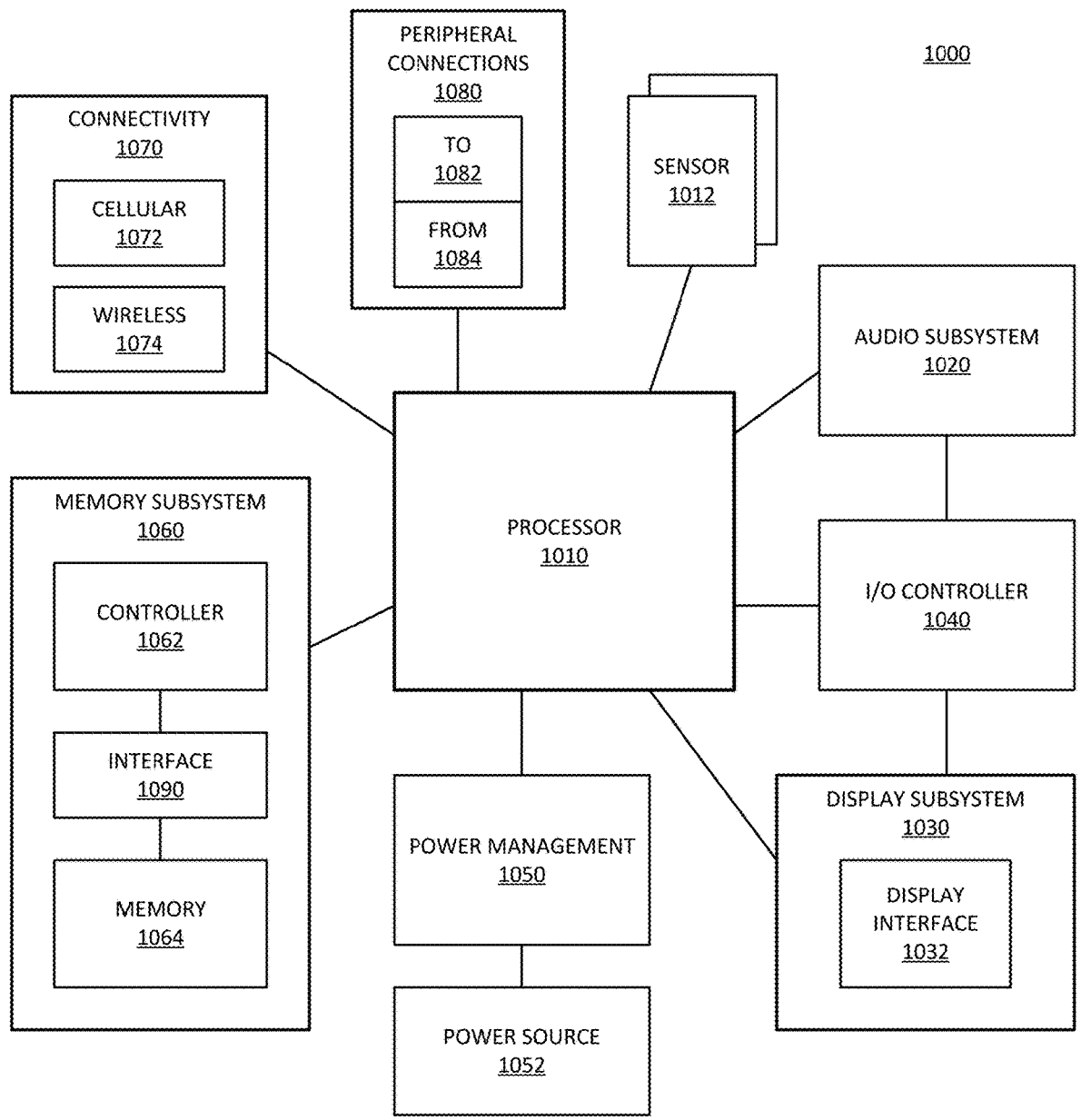
FIG. 10 is a block diagram of an example of a mobile device in which a memory module interface can be implemented.

FIG. 10 is a block diagram of an example of a mobile device in which a memory module interface can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 represents a computer system in accordance with an example of system 100 or system 700.

In one example, system 1000 includes interface 1090 to interconnect a memory module that holds memory 1064 with memory controller 1062. In one example, memory controller 1062 is disposed on a system board that includes pins, pads, or connectors to connect with memory 1064. Interface 1090 represents an interconnection between memory 1062 and a system board in accordance with any example herein. In one example, interface 1090 represents connectors on the system board to interconnect with pads on a memory module of memory 1064. In one example, interface 1090 represents connectors on a memory module of memory 1064 to interconnect with the system board. In one example, interface 1090 represents a connector to interconnect with pads on the system board and with pads on a memory module of memory 1064.

System 1000 includes processor 1010, which performs the primary processing operations of system 1000. Processor 1010 can be a host processor device. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory module, includes: a first printed circuit board (PCB) surface including a first pad layout matching a pin layout of a memory device, to electrically interconnect to the memory device; and a second PCB surface opposite the first PCB surface, the second PCB surface including a second pad layout matching the pin layout of the memory device, the second pad layout to electrically interconnect to a matching pad layout on a system board.

In one example of the memory module, the second pad layout is electrically connected with the first pad layout with through-hole connectors, without routing traces between corresponding pads. In accordance with any preceding example of the memory module, in one example, the matching pad layout on the system board includes a compression-based contact corresponding to each pad, wherein pads of the second pad layout physically contact corresponding compression-based contacts of the matching pad layout on the system board. In accordance with any preceding example of the memory module, in one example, second PCB surface includes a spring corresponding to each pad, wherein pads of the matching pad layout of the system board physically contact corresponding springs of the second pad layout. In accordance with any preceding example of the memory module, in one example, the memory device comprises a first memory device; wherein the first PCB surface further comprises a third pad layout matching a pin layout of a second memory device, to electrically interconnect to the second memory device; and wherein the second PCB surface comprises a fourth pad layout matching the pin layout of the second memory device, the fourth pad layout to electrically interconnect to a matching pad layout on a system board. In accordance with any preceding example of the memory module, in one example, the system board comprises a motherboard. In accordance with any preceding example of the memory module, in one example, the first PCB surface and the second PCB surface comprise surfaces of a 2-layer PCB. In accordance with any preceding example of the memory module, in one example, the memory device comprises a dynamic random access memory (DRAM) device compatible with a double data rate (DDR) standard. In accordance with any preceding example of the memory module, in one example, the DRAM device comprises a DRAM device compatible with a low power double data rate (LPDDR) standard.

In general with respect to the descriptions herein, in one example a computer system includes: a system board including a system pad layout matching a pin layout of a memory device; a memory module including: a memory device mounted to a first pad layout of a first printed circuit board (PCB) surface, the first pad layout matching the pin layout of the memory device; and a second PCB surface opposite the first PCB surface, the second PCB surface including a second pad layout matching the pin layout of the memory device, the second pad layout to electrically interconnect to a matching pad layout on a system board; and a contact assembly having an array of contacts matching the pin layout of the memory device, the contact assembly disposed between the system board and the memory module to electrically interconnect the second pad layout with the system pad layout.

In one example of the computer system, the second pad layout is electrically connected with the first pad layout with through-hole connectors, without routing traces between corresponding pads. In accordance with any preceding example of the computer system, in one example, the array of contacts comprises a spring structure to contact each pad of the second pad layout. In accordance with any preceding example of the computer system, in one example, the array of contacts comprises a spring structure to contact each pad of the system pad layout. In accordance with any preceding example of the computer system, in one example, the contact assembly is soldered directly on the system pad layout of the system board. In accordance with any preceding example of the computer system, in one example, the contact assembly is soldered directly on the second pad layout of the memory module. In accordance with any preceding example of the computer system, in one example, the contact assembly comprises a contact assembly of an interposer board to be removably disposed between the system board and the memory module. In accordance with any preceding example of the computer system, in one example, the memory device comprises a first memory device; wherein the first PCB surface further comprises a third pad layout matching a pin layout of a second memory device, to electrically interconnect to the second memory device; and wherein the second PCB surface comprises a fourth pad layout matching the pin layout of the second memory device, the fourth pad layout to electrically interconnect to a matching pad layout on a system board. In accordance with any preceding example of the computer system, in one example, the system board comprises a motherboard. In accordance with any preceding example of the computer system, in one example, the computer system includes: screws to secure the memory module to the system board, including to secure the contact assembly to ensure electrical interconnection of the second pad layout with the system pad layout. In accordance with any preceding example of the computer system, in one example, the system pad layout comprises a first system pad layout, the memory module comprises a first memory module, and the contact assembly comprises a first contact assembly, wherein the system board includes the first system pad layout on a first system board surface, and further comprising: a second system pad layout on a second system board surface; a second memory module; and a second contact assembly to interconnect the second memory module to the second system pad layout. In accordance with any preceding example of the computer system, in one example, the memory device comprises a dynamic random access memory (DRAM) device compatible with a double data rate (DDR) standard. In accordance with any preceding example of the computer system, in one example, the DRAM device comprises a DRAM device compatible with a low power double data rate (LPDDR) standard. In accordance with any preceding example of the computer system, in one example, the computer system further includes one or more of: a host processor device mounted on the system board; a display communicatively coupled to a host processor of the system board; a network interface communicatively coupled to a host processor of the system board; or a battery to power the computer system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:
1. A memory module, comprising:
   a first printed circuit board (PCB) surface including a first pad layout matching a pin layout of a contact array of a memory chip package of a memory chip, to electrically interconnect to the memory chip; and
   a second PCB surface opposite the first PCB surface, the second PCB surface including a second pad layout matching the pin layout of the memory chip package, the second pad layout having spring structures to electrically interconnect to a matching pad layout on a system board, the spring structures to compress when the memory module is mounted to the system board.
2. The memory module of claim 1, wherein the second pad layout is electrically connected with the first pad layout with through-hole connectors, without routing traces between corresponding pads.

3. The memory module of claim 1, wherein the matching pad layout on the system board includes a compression-based contact corresponding to each pad, wherein pads of the second pad layout physically contact corresponding compression-based contacts of the matching pad layout on the system board.

4. The memory module of claim 1, wherein the second PCB surface includes a compression-based contact corresponding to each pad, wherein pads of the matching pad layout of the system board physically contact corresponding compression-based contacts of the second pad layout.

5. The memory module of claim 1, wherein the memory chip comprises a first memory chip;
wherein the first PCB surface further comprises a third pad layout matching a pin layout of a second memory chip package of a second memory chip, to electrically interconnect to the second memory chip; and
wherein the second PCB surface comprises a fourth pad layout matching the pin layout of the second memory chip, the fourth pad layout to electrically interconnect to a matching pad layout on a system board.

6. The memory module of claim 1, wherein the system board comprises a motherboard.

7. The memory module of claim 1, wherein the first PCB surface and the second PCB surface comprise surfaces of a 2-layer PCB.

8. The memory module of claim 1, wherein the memory chip comprises a dynamic random access memory (DRAM) device compatible with a double data rate (DDR) standard.

9. The memory module of claim 8, wherein the DRAM device comprises a DRAM device compatible with a low power double data rate (LPDDR) standard.

10. A computer system comprising:
a system board including a system pad layout matching a pin layout of a memory chip package of a memory chip;
a memory module including:
the memory chip mounted to a first pad layout of a first printed circuit board (PCB) surface, the first pad layout matching the pin layout of the memory chip package; and
a second PCB surface opposite the first PCB surface, the second PCB surface including a second pad layout matching the pin layout of the memory chip package, the second pad layout to electrically interconnect to a matching pad layout on a system board; and
a contact assembly having an array of contacts matching the pin layout of the memory chip package, the contact assembly disposed between the system board and the memory module to electrically interconnect the second pad layout with the system pad layout, wherein the array of contacts comprises a spring structure to contact each pad of the system pad layout.

11. The computer system of claim 10, wherein the second pad layout is electrically connected with the first pad layout with through-hole connectors, without routing traces between corresponding pads.

12. The computer system of claim 10, wherein the array of contacts further comprises a spring structure to contact each pad of the second pad layout.

13. The computer system of claim 10, wherein the contact assembly is soldered directly on the system pad layout of the system board.

14. The computer system of claim 10, wherein the contact assembly is soldered directly on the second pad layout of the memory module.

15. The computer system of claim 10, wherein the contact assembly comprises a contact assembly of an interposer board to be removably disposed between the system board and the memory module.

16. The computer system of claim 10, wherein the memory chip comprises a first memory chip;
wherein the first PCB surface further comprises a third pad layout matching a pin layout of a second memory chip package of a second memory chip, to electrically interconnect to the second memory chip; and
wherein the second PCB surface comprises a fourth pad layout matching the pin layout of the second memory chip package, the fourth pad layout to electrically interconnect to a matching pad layout on a system board.

17. The computer system of claim 10, wherein the system board comprises a motherboard.

18. The computer system of claim 10, further comprising:
screws to secure the memory module to the system board, including to secure the contact assembly to ensure electrical interconnection of the second pad layout with the system pad layout.

19. The computer system of claim 10, wherein the system pad layout comprises a first system pad layout, the memory module comprises a first memory module, and the contact assembly comprises a first contact assembly, wherein the system board includes the first system pad layout on a first system board surface, and further comprising:
a second system pad layout on a second system board surface;
a second memory module; and
a second contact assembly to interconnect the second memory module to the second system pad layout.

20. The computer system of claim 10, wherein the memory chip comprises a dynamic random access memory (DRAM) device compatible with a double data rate (DDR) standard.

21. The computer system of claim 20, wherein the DRAM device comprises a DRAM device compatible with a low power double data rate (LPDDR) standard.

22. The computer system of claim 10, further comprising one or more of:
a host processor device mounted on the system board;
a display communicatively coupled to a host processor of the system board;
a network interface communicatively coupled to a host processor of the system board; or
a battery to power the computer system.

* * * * *